US010823778B2

(12) United States Patent
Akiyama et al.

(10) Patent No.: US 10,823,778 B2
(45) Date of Patent: Nov. 3, 2020

(54) INSPECTION SYSTEM

(71) Applicant: TOKYO ELECTRON LIMITED, Tokyo (JP)

(72) Inventors: Shuji Akiyama, Yamanashi (JP); Takeo Saito, Yamanashi (JP); Eiichi Matsuzawa, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 90 days.

(21) Appl. No.: 16/049,774

(22) Filed: Jul. 30, 2018

(65) Prior Publication Data

US 2019/0041454 A1    Feb. 7, 2019

(30) Foreign Application Priority Data

Aug. 3, 2017    (JP) .................................. 2017-151113

(51) Int. Cl.
*G01R 31/28*    (2006.01)

(52) U.S. Cl.
CPC ..... *G01R 31/2877* (2013.01); *G01R 31/2831* (2013.01); *G01R 31/2862* (2013.01); *G01R 31/2881* (2013.01); *G01R 31/2893* (2013.01)

(58) Field of Classification Search
CPC ............ G01R 31/2889; G01R 31/2891; G01R 31/2874; G01R 31/2863; G01R 31/2851; G01R 1/025; G01R 31/2887; G01R 31/2886; G01R 31/2893; G01R 1/07378; G01R 31/31905; G01R 1/07307; G01R 31/2894; G01R 31/2875; G01R 31/307;

(Continued)

(56) References Cited

U.S. PATENT DOCUMENTS 6,111,421 A *  8/2000  Takahashi .......... G01R 31/2868
                                                    324/750.04
6,583,638 B2 *  6/2003  Costello ............ H01L 21/67109
                                                    324/750.09
(Continued)

FOREIGN PATENT DOCUMENTS

JP    H9-298225     11/1997
JP    2013-254812   12/2013
(Continued)

*Primary Examiner* — Vinh P Nguyen
(74) *Attorney, Agent, or Firm* — Fenwick & West LLP

(57) ABSTRACT

An inspection system, for inspecting an inspection target on a stage in a low temperature environment, includes a system main body including an inspection apparatus having inspection chambers each accommodating an inspection unit for performing electrical inspection of an inspection target on a stage and having inspection spaces arranged in multiple stages vertically, the plurality of inspection chambers being arranged horizontally, and a loader unit for transferring the inspection target with respect to the stage of the inspection unit; and a coolant supply unit configured to supply a coolant to the stage. The system main body further includes coolant line arrangement spaces, in which coolant lines extending from the coolant supply unit are arranged, provided above or below the respective inspection spaces to correspond to the respective inspection spaces, and the coolant lines are directed toward the corresponding inspection spaces in each of the coolant line arrangement spaces.

16 Claims, 10 Drawing Sheets

(58) Field of Classification Search
CPC .......... G01R 31/2865; G01R 31/2831; G01R 31/31901; G01R 31/3191; G01R 1/0491; G01R 31/2601; G01R 31/2877; G01R 31/318511; G01R 1/00; G01R 1/04; G01R 1/0408; G01R 31/2818; G01R 31/2867; G01R 31/2884; G01R 31/2862; G01R 31/2881; G06F 3/0338
See application file for complete search history.

(56) References Cited

U.S. PATENT DOCUMENTS

| | | | |
|---|---|---|---|
| 8,493,083 B2* | 7/2013 | Kiyokawa | G01R 31/2891 324/750.16 |
| 8,513,962 B2* | 8/2013 | Kiyokawa | G01R 31/2893 324/750.2 |
| 2005/0035311 A1* | 2/2005 | Asakawa | G01N 21/8806 250/559.16 |
| 2015/0168449 A1 | 6/2015 | Yamada | |

FOREIGN PATENT DOCUMENTS

| | | |
|---|---|---|
| JP | 2014-192218 A | 10/2014 |
| KR | 10-2016-0009482 A | 1/2016 |

* cited by examiner

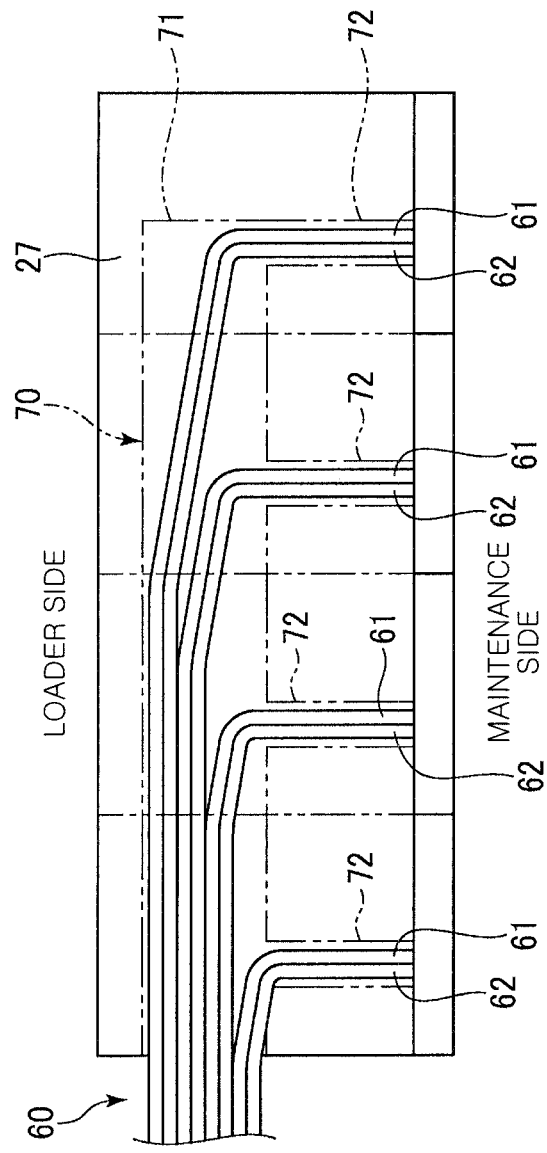

INSPECTION SYSTEM

CROSS-REFERENCE TO RELATED APPLICATIONS

This application claims priority to Japanese Patent Application No. 2017-151113 filed on Aug. 3, 2017, the entire contents of which are incorporated herein by reference.

FIELD OF THE INVENTION

The present disclosure relates to an inspection system for inspecting a substrate in a low temperature region.

BACKGROUND OF THE INVENTION

In a semiconductor device manufacturing process, a plurality of semiconductor elements (devices) formed on a semiconductor wafer (hereinafter, simply referred to as "wafer") as a substrate is electrically inspected upon completion of all processes in the wafer. Generally, an inspection apparatus for performing electrical inspection includes a loader unit for transferring a wafer and a prober unit for performing electrical inspection of the wafer transferred from the loader unit. The prober unit includes a wafer stage (chuck top) for holding a wafer, a probe card having probes to be in contact with a plurality of devices formed on the wafer, and an aligner for performing position alignment of the wafer and the probe card. Various electrical characteristics of the device are inspected by applying an electrical signal to the devices formed on the wafer from a tester through the probe card.

A semiconductor device may operate under a low temperature environment of, e.g., −30° C. In order to ensure the operation of the semiconductor device under such an environment, it is required, to perform electrical inspection of the device by controlling a temperature of the wafer to such a low temperature region.

As for an inspection apparatus for performing inspection in a low temperature region, there is suggested an apparatus for cooling a wafer stage provided in a housing to a predetermined low temperature region by supplying a coolant to the wafer stage and preventing condensation on the wafer stage by supplying air of a low dew point into the housing (e.g., Japanese Patent Application Publication No. H9-298225).

Recently, in order to efficiently perform the electrical inspection on a plurality of wafers, there is used an inspection apparatus (inspection system) in which a plurality of inspection units, each including a wafer stage, a probe card, and a tester, is horizontally arranged in each of multiple stages arranged in a height direction (e.g., Japanese Patent Application Publication No. 2013-254812).

If the electrical inspection can be performed in a low temperature region by the inspection system having a plurality of inspection units, the electrical inspection in the low temperature region can be efficiently performed.

In the inspection apparatus having a single prober unit as disclosed in Japanese Patent Application Publication No. H9-298225, it is possible to cool the wafer stage simply by connecting a line for supplying and discharging the coolant from an external chiller unit to the wafer stage. However, in the inspection system in which the inspection units are arranged vertically and horizontally as disclosed in Japanese Patent Application Publication No. 2013-254812, the wafer stage is provided in each of the inspection units and, thus, a plurality of coolant lines is required. If the coolant line is directly connected to the wafer stage from the outside, it is difficult to perform maintenance.

In the inspection system in which the inspection units are arranged vertically and horizontally, it is difficult to set the entire system to a low dew point environment and also difficult to deal with condensation. In addition, since the inspection unit has a complicated inner structure, it is required to extend the coolant line connected to the wafer stage and a large space may be required to ensure the space for the coolant line.

SUMMARY OF THE INVENTION

In view of the above, the present disclosure provides a technique capable of easily performing maintenance, preventing condensation, and performing low temperature inspection while saving a space in an inspection system having a configuration in which a plurality of inspection units is arranged vertically and horizontally.

In accordance with an aspect, there is provided an inspection system for inspecting an inspection target on a stage in a low temperature environment. The inspection system includes: a system main body including an inspection apparatus having a plurality of inspection chambers each accommodating an inspection unit for performing electrical inspection of an inspection target on a stage and having a plurality of inspection spaces arranged in multiple stages in a vertical direction, the plurality of inspection chambers being arranged in a horizontal direction, and a loader unit configured to transfer the inspection target with respect to the stage of the inspection unit of the inspection apparatus; and a coolant supply unit configured to supply a coolant to the stage. The system main body further includes a plurality of coolant line arrangement spaces, in which a plurality of coolant lines extending from the coolant supply unit are arranged, provided above or below the respective inspection spaces to correspond to the respective inspection spaces, and the coolant lines are directed toward the corresponding inspection spaces in each of the coolant line arrangement spaces.

BRIEF DESCRIPTION OF THE DRAWINGS

The objects and features of the present disclosure will become apparent from the following description of embodiments, given in conjunction with the accompanying drawings, in which:

FIG. 10 is a top view for explaining an arrangement state of the coolant supply line and the coolant return line in the coolant line arrangement space;

DETAILED DESCRIPTION OF THE EMBODIMENTS

Hereinafter, embodiments will be described in detail with reference to the accompanying drawings.

Figure 2:
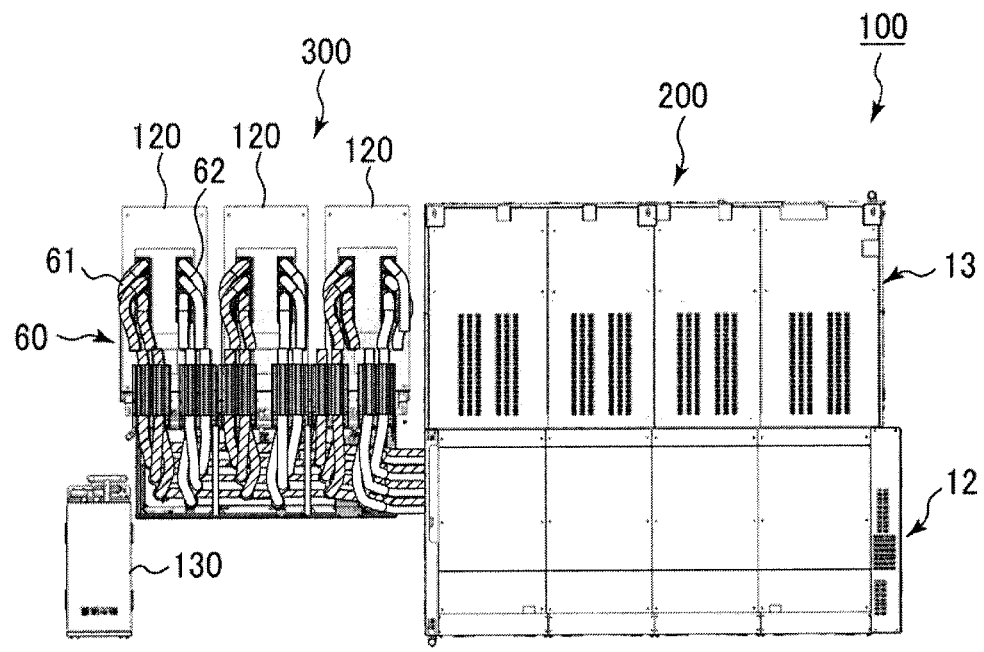
FIG. 2 is a top view showing the external appearance of the inspection system according to the embodiment.
Figure 3:
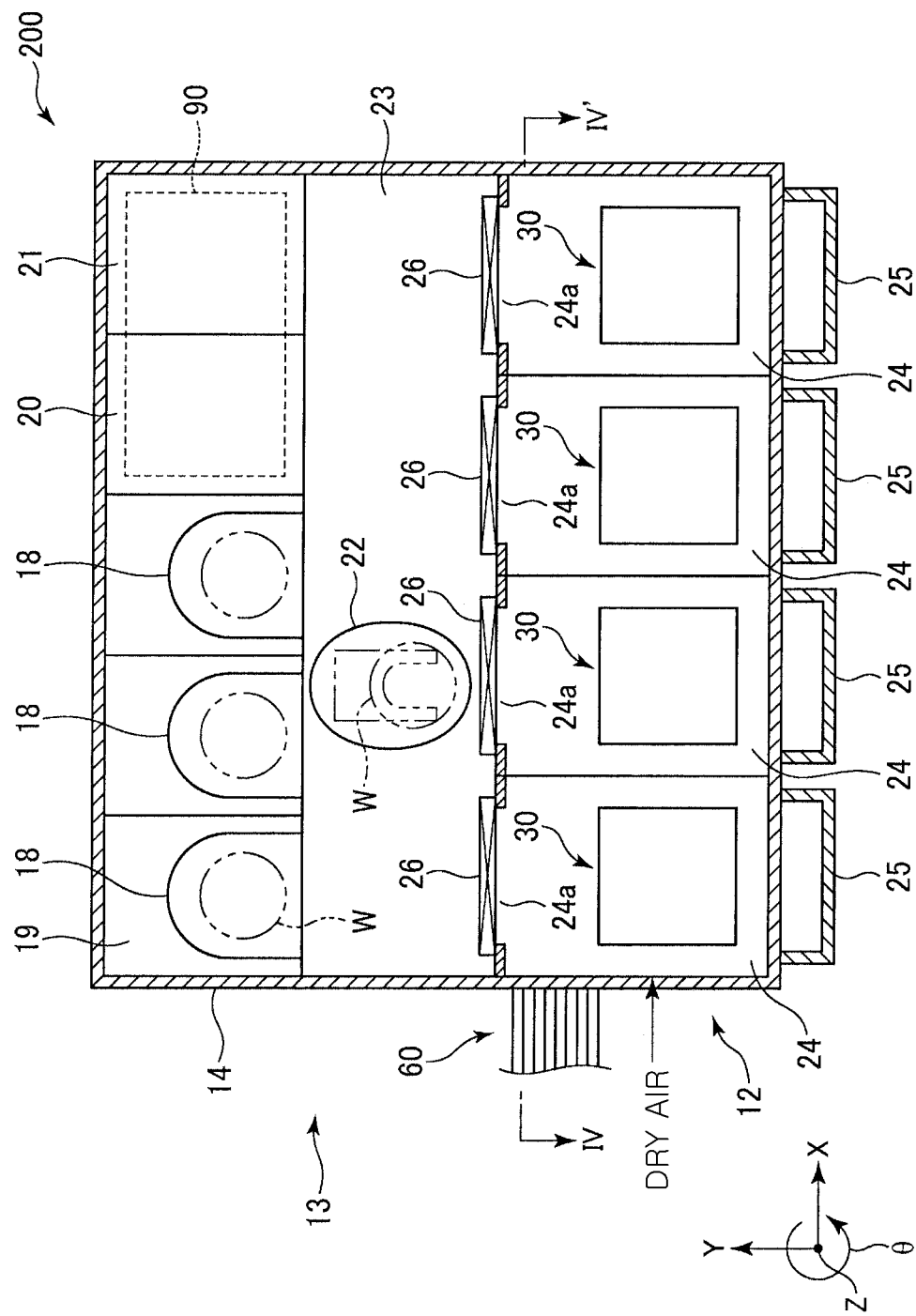
FIG. 3 is a horizontal cross sectional view showing a system main body of the inspection system according to the embodiment.
Figure 4:
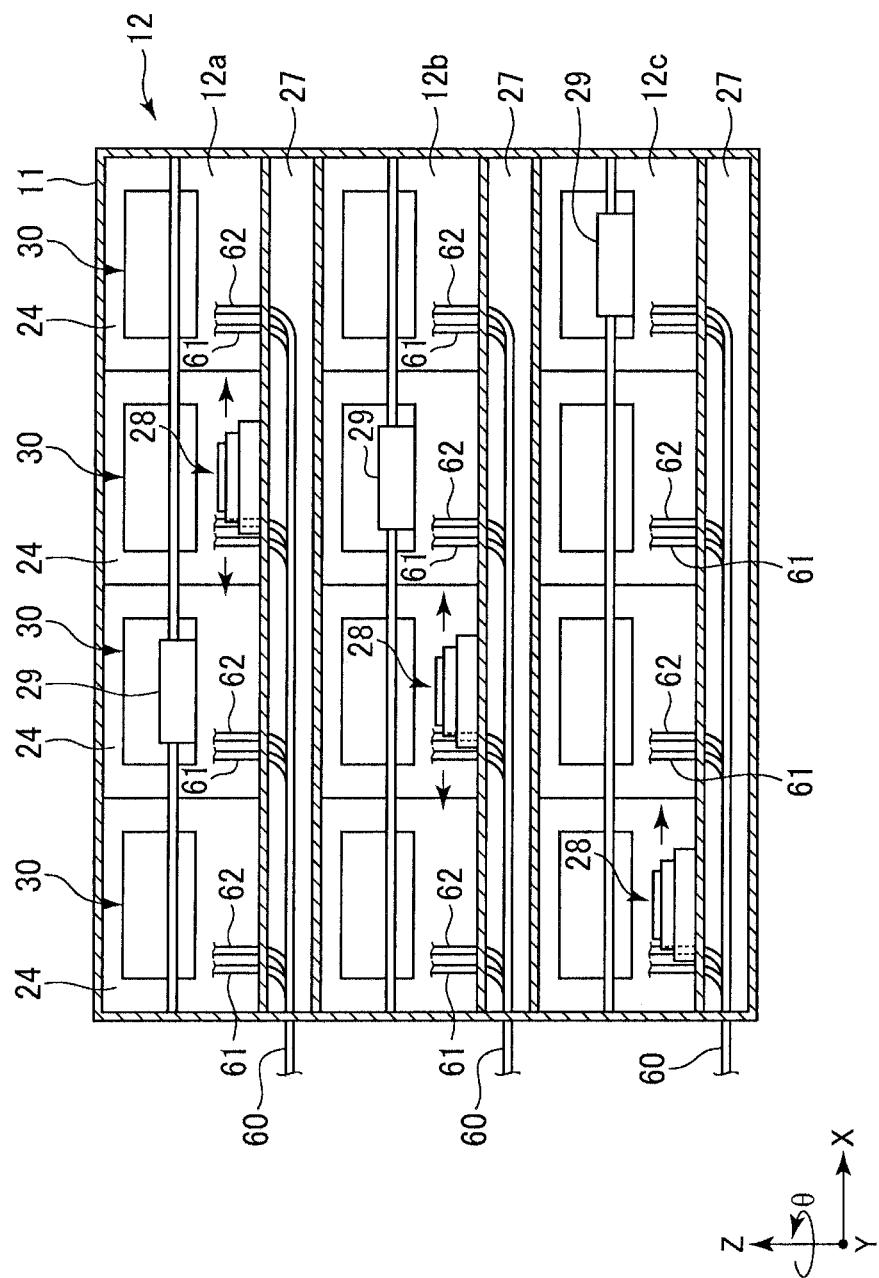
FIG. 4 is a cross sectional view of the system main body shown in FIG. 3 which is taken along a line IV-IV.
Figure 5:
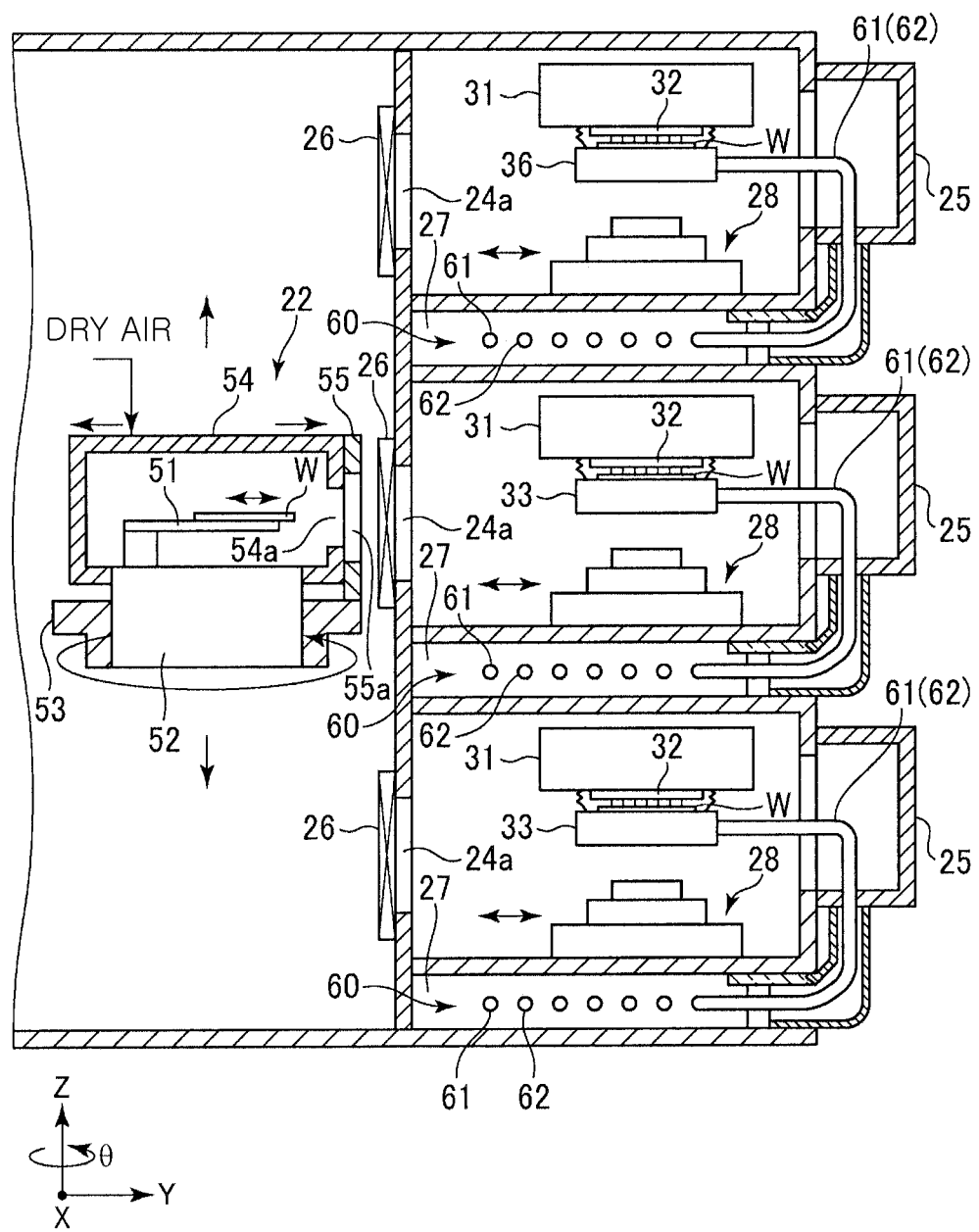
FIG. 5 is a cross sectional view of the system main body shown in FIG. 3 which is taken along the Y direction.

FIG. is a perspective view showing an external appearance of an inspection system according to an embodiment. FIG. 2 is a top view showing the external appearance of the inspection system according to the embodiment. FIG. 3 is a horizontal cross sectional view showing a system main body of the inspection system according to the embodiment. FIG. 4 is a cross sectional view of the system main body shown in FIG. 3 which is taken along a line IV-IV'. FIG. 5 is a cross sectional view of the system main body shown in FIG. 3 which is taken along the Y direction.

An inspection system 100 of the present embodiment configured to inspect electrical characteristics of a plurality of devices formed on a wafer as a target object in a low temperature environment of, e.g., −30° C. The inspection system 100 includes a system main body 200 for performing actual inspection, and a coolant supply unit 300 for supplying a coolant to the system main body 200.

Figure 1:
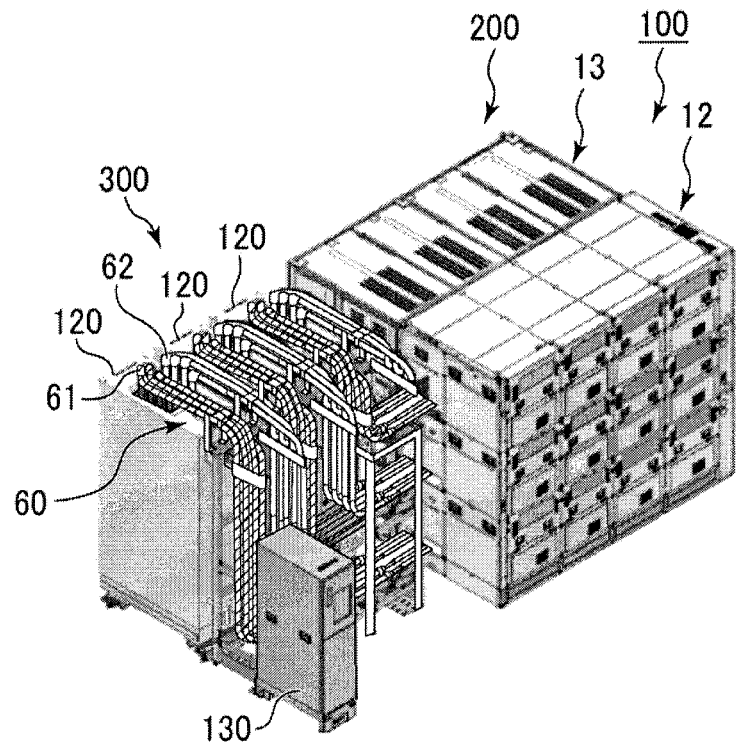
FIG. 1 is a perspective view showing an external appearance of an inspection system according to an embodiment.

As shown in FIGS. 1 and 2, the system main body 200 includes an inspection apparatus 12 having a plurality of inspection units for performing electrical inspection on a wafer (devices formed on the wafer), and a loader unit 13 for transferring a wafer to the inspection apparatus 12.

The coolant supply unit 300 has three chiller units 120 for supplying a coolant to the system main body 200. A coolant line group 60 including a plurality of coolant lines for supplying a coolant from the chiller units 120 or returning a coolant to the chiller units 120 extends into the system main body 200. A reference numeral 130 denotes a heat exchanger.

As shown in FIGS. 3 to 5, the system main body 200 is formed by connecting the inspection apparatus 12 and the loader unit 13.

In the inspection apparatus 12, four inspection chambers (cells) 24 are arranged along the X direction and the array of the four inspection chambers is arranged in three stages along the Z direction (vertical direction). The inspection chambers in each stage communicate with each other to form a single inspection space that is substantially sealed. Thus, an upper inspection space 12a, an intermediate inspection space 12b, and a lower inspection space 12c are formed. A coolant line arrangement space 27 where the coolant line group 60 extends from the coolant supply unit 300 is provided between the upper inspection space 12a and the intermediate inspection space 12b, between the intermediate inspection space 12b and the lower inspection space 12c, and below the lower inspection space 12c. As will be described later, four coolant supply lines 61 and four coolant return lines 62 are provided as the coolant line group 60 in each coolant line arrangement space 27 to correspond to the four inspection units 30 directly above the corresponding coolant line arrangement space 27. A rear side of the inspection apparatus 12 which is opposite to a side facing the loader unit 13 is set to a maintenance side.

The inspection unit (prober) 30 including a tester 31 for wafer inspection, a probe card 32, and a chuck top (wafer stage) 36 for holding the wafer W is provided in each of the inspection chambers 24. In each of the upper inspection space 12a, the intermediate inspection space 12b, and the lower inspection space 12c, a single aligner (stage) 28 capable of moving in the X direction and configured to align the wafer W and attach/detach the wafer W to/from the four inspection units 30 arranged in the X direction is provided below the inspection unit 30. Further, in each of the upper inspection space 12a, the intermediate inspection space 12b, and the lower inspection space 12c, a single alignment camera 29 capable of moving in the X direction is provided closer to the loader unit 13 than the inspection unit 30. The inspection unit 30 will be described in detail later.

A cell control unit 25 that is a control device of each of the inspection units 30 is provided at a rear side of each of the inspection chambers 24. The cell control unit 25 includes a solenoid, a vacuum sensor, an electro-pneumatic regulator, an E-IOM substrate, a temperature controller and the like. The E-IOM substrate that is an electric device, the solenoid that is an air/vacuum device, the vacuum sensor, and the electro pneumatic regulator are separated from each other. A transfer port 24a is provided at a front side of each of the inspection chambers 24. The transfer port 24a can be opened and closed by a shutter 26. The inspection chamber 24 and the cell control unit 25 communicate with each other.

The loader unit 13 includes: a loading/unloading unit 14, in which mounting tables 19 for mounting thereon FOUPs 18 as containers accommodating a plurality of wafers W, a probe card loader 20 and a position alignment unit 21 are arranged in the X direction, disposed to face the inspection apparatus 12; and a transfer chamber 23, provided between the loading/unloading unit 14 and the inspection apparatus 12, where a transfer mechanism 22 for transferring the wafer W moves. A control unit 90 is provided inside the loading/unloading unit 14.

As shown in FIG. 5, the transfer mechanism 22 includes: a transfer arm 51 for supporting the wafer W; a rotation driving unit 52 for supporting and rotating the transfer arm; a base portion 53 for supporting the rotation driving unit 52; a cylindrical cover member 54 that is a container which is supported by the rotation driving unit 52 and encompasses the transfer arm 51; a frame-shaped member 55 fixed to a side of the base portion 53 facing the inspection apparatus 12 and having a transfer port 55a for the wafer W; and a shielding wall (not shown) formed as one unit with the frame-shaped member 55 to cover a part of an outer periphery of the cover member 54. The cover member 54 is configured to rotate with the transfer arm 51 by the rotation driving unit 52. Further, the cover member 54 has a transfer port 54a for the wafer W. Dry air of a low dew point can be supplied into the cover member 54. By supplying dry air of a low dew point into the cover member 54 in a state where the transfer port 54a is blocked by the shielding wall by rotating the cover member 54, it is possible to create a low dew point environment and deal with condensation. The transfer mechanism 22 is movable in the Z direction and the X direction.

The transfer mechanism 22 receives uninspected wafers W from the FOUP 18 by the back-and-forth movement and the rotation in the θ direction of the transfer arm 51 and transfers the wafers W to the inspection chambers 24 in each stage. Further, the transfer mechanism 22 receives inspected wafers K and returns the wafers W to the FOUP 18. When the wafers W are transferred with respect to the inspection chamber 24, a low dew point environment is created inside the cover member 54 by dry air, and the wafers W are transferred by aligning the transfer ports 54a, 55a and 24a in a state where the frame-shaped member 55 is brought into close contact with a peripheral portion of the transfer port 24a of the inspection chamber 24.

Further, the transfer mechanism 22 transfers probe cards requiring maintenance from the inspection units 30 to the probe card loader 20 and also transfers a new probe card or a probe card that has been subjected to maintenance to the inspection units 30.

Figure 6:
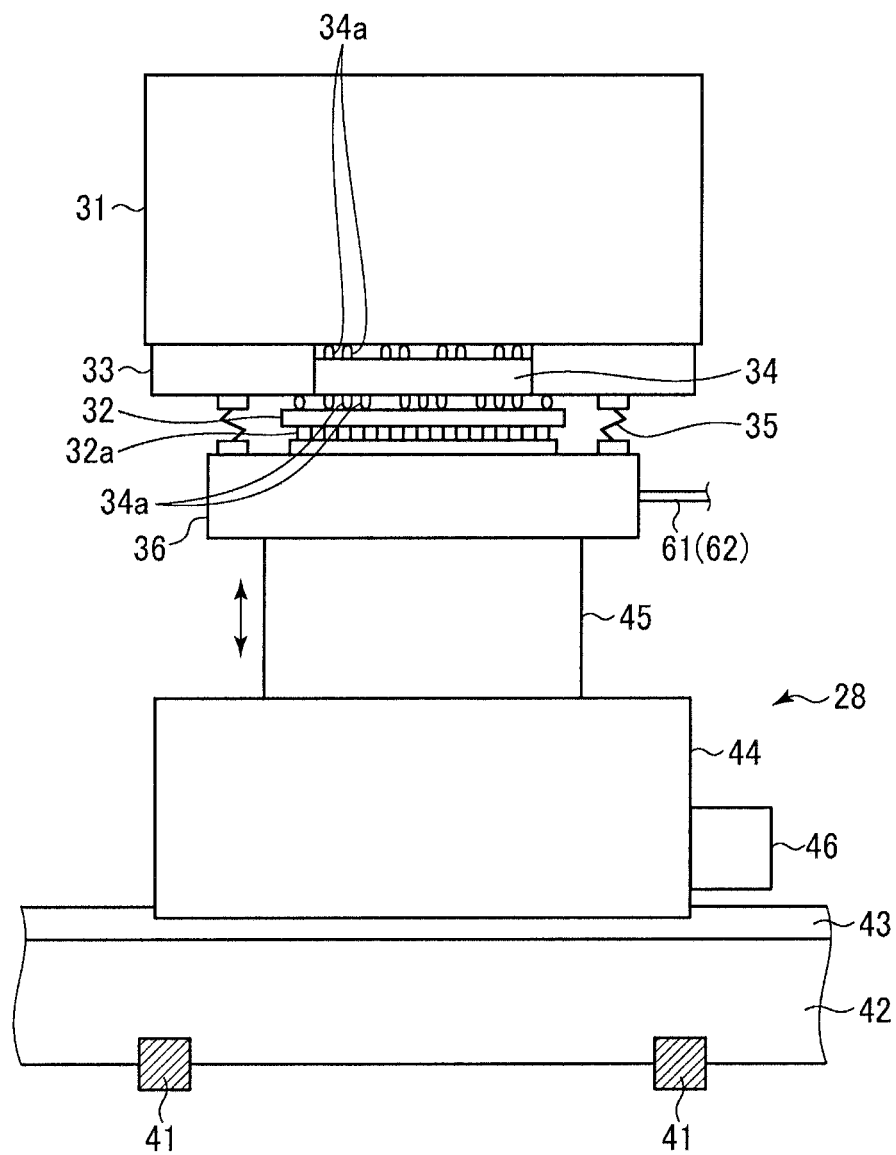
FIG. 6 shows a schematic configuration of an inspection unit of the system main body shown in FIG. 3.

FIG. 6 shows a schematic configuration of the inspection unit 30. The inspection unit 30 includes: a tester 31 for sending an inspection signal to devices formed on the wafer W; a probe card 32 having a plurality of probes 32a to be in contact with electrodes of the devices formed on the wafer W; a supporting plate 33, provided below the tester 31, for supporting the probe card 32; a contact block 34 for connecting the tester 31 and the probe card 32; a bellows 35 suspended from the supporting plate 33 and surrounding the probe card 32; and a chuck top (wafer stage) 36 for attracting and holding the wafer W by vacuum suction and controlling a temperature of the wafer W. A plurality of pogo pins 34a for electrically connecting the probe card 32 and the tester 31 is provided on an upper and a lower surface of the contact block 34. The bellows 35 is used for forming a sealed space encompassing the probe card 32 and the wafer W in a state where the wafer W on the chuck top 36 is brought into contact with the plurality of probes 32a of the probe card 32. By evacuating the sealed space through a vacuum line, the chuck top 36 is attracted to the supporting plate 33. The probe card 32 is also attracted to the supporting plate 33 by evacuation.

The aligner 23 includes: an X block 42 movable in the X direction on a guide rail 41 provided on a base plate in a corresponding stage; a Y block 42 movable in the Y direction on a guide rail 43 provided on the X block 42; and a Z block 45 movable in the Z direction with respect to the Y block 44. The chuck top 36 is engaged on the Z block 45 in a state where predetermined positional relation is maintained. A lower camera 46 for imaging a lower surface of the probe card 32 is provided on a peripheral wall of the Y block 44.

The aligner 28 can access the inspection units 30 by moving the X block 42 in the X direction. The chuck top 36 for mounting thereon a wafer is moved in the X direction, the Y direction and the Z direction by moving the X block 42, the Y block 44 and the Z block 45 by a moving unit (not shown) so that the position alignment of the wafer W as an inspection target with respect to each inspection unit 30, mounting of the wafer W on the chuck top 36 to the probe card 32, separation of the wafer W on the chuck top 36 from the probe card 32, transfer of the wafer K with respect to the transfer mechanism 22, or the like can be performed.

When transferring the wafer W to the chuck top 36 and attach the wafer W to the probe card 32, the wafer is transferred from the transfer mechanism 22 onto the chuck top 36 on the aligner 28; the wafer W is aligned with the probe card 32; the chuck top 36 is then raised by the aligner 28. Accordingly, the wafer W is brought into contact with the probes 32a of the probe card 32. Thereafter, the chuck top 36 is raised further to press the wafer N against the probes 32a. In this state, the chuck top 36 is attracted to the supporting plate 33 by evacuating the space surrounded by the bellows 35, and the state in which the wafer is pressed against the probes 32a is maintained. In this state, electrical inspection using the tester 31 is started. At this time, the Z block 45 of the aligner 22 is retreated downward, and the aligner 22 is moved to another inspection unit 30 where the inspection has been completed. By performing the above-described operations in a reverse order, the chuck top 36 after the inspection is lowered and the inspected wafer W on the chuck top 36 is returned to the FOUP 18 by the transfer mechanism 22.

The three chiller units 120 of the coolant supply unit 300 correspond to the inspection unit 30 of the upper inspection space 12a, the inspection unit 30 of the intermediate inspection space 12b, and the inspection unit 30 of the lower inspection space 12c, respectively. Four coolant supply lines 61 and four coolant return lines 62 extend from the coolant line group 60 connected to each chiller unit 120.

The four coolant supply lines 61 and the four coolant return lines 62 connected to each chiller unit 120 extend to the coolant line arrangement space 21 in the system main body 200. The coolant supply lines 61 and the coolant return lines 62 are flexible lines (hoses). The coolant supply lines 61 and the coolant return lines 62 extend toward the maintenance side (rear side) at positions corresponding to the inspection units 30 directly above them and are bent upward toward the cell control unit 25. Then, the coolant supply lines 61 and the coolant return lines 62 are connected, via the cell control unit 25, to the chuck top 36 in the corresponding inspection chamber 24 (see FIG. 5). A low-temperature coolant is supplied from each chiller unit 120 to the chuck, tops 36 of the inspection units 30 in the corresponding stage through the coolant supply lines 61 and returned to each chiller unit 120 through the coolant return lines 62. In the case of performing low temperature inspection at, e.g., −30° C., a coolant of −35° C. is used.

The following configuration is provided to prevent condensation from occurring at any position of the system in the case of supplying a low-temperature coolant.

An atmospheric atmosphere of a room temperature is maintained in a space between the chiller unit 120 and the system main body 200. Therefore, if the surface temperatures of the coolant supply lines 61 and the coolant return lines 62 are low, condensation occurs on the surfaces of the coolant supply lines 61 and the coolant return lines 62. Accordingly, a thick heat insulating material such as foamed urethane or the like covers the coolant supply lines 61 and the coolant return lines 62 to make the surface temperatures of the coolant supply lines 61 and the coolant return lines 62 higher than a dew point.

Figure 7:
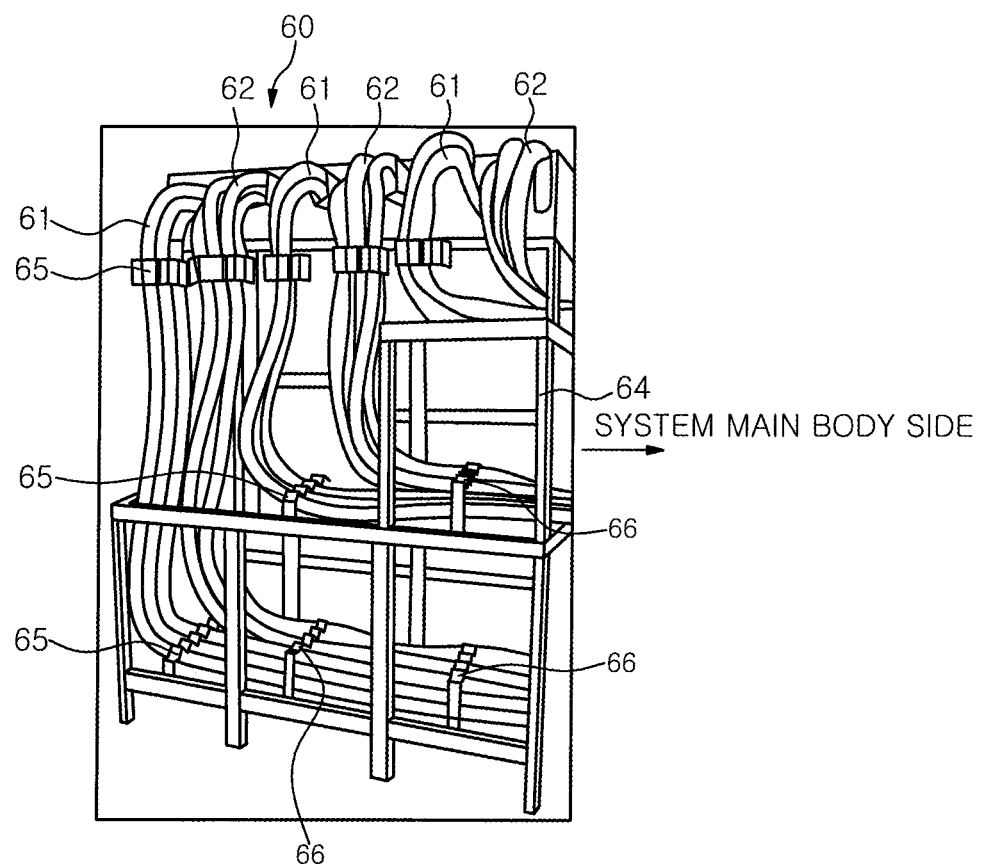
FIG. 7 shows a configuration for preventing deformation of a thick heat insulating material covering a coolant supply line and a coolant return line extended from a chiller unit of a coolant supply unit to the system main body.
Figure 8:
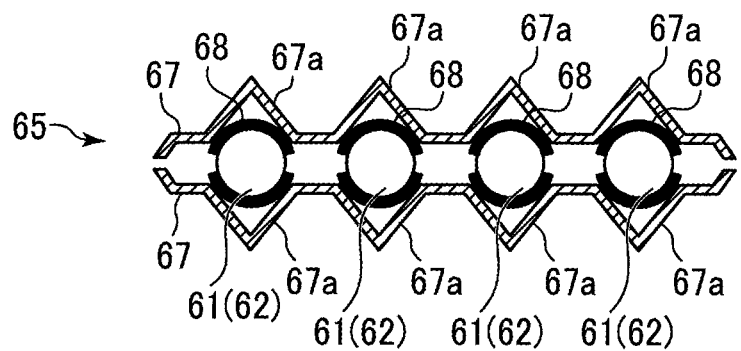
FIG. 8 shows a line arrangement member for fixing the coolant supply line and the coolant return line covered with the thick heat insulating material with a gap interposed therebetween.

When the heat insulating material is deformed by the contact between the lines, the heat insulating effect deteriorates. Therefore, as shown in FIG. 7, the contact between the four coolant supply lines 61 and the four coolant return lines 62 from each chiller unit 120 is prevented by using a frame 64 for guiding the lines and a line arrangement member 65 for fixing the coolant supply lines 61 and the coolant return lines 62 which are covered with the heat insulating material with a gap interposed therebetween. Specifically, the four coolant supply lines 61 and the four coolant return lines 62 from each chiller unit 120 are grouped and suspended downward from each chiller unit 120. The contact between the suspended four coolant supply lines 61 and the suspended four coolant return lines 62 is prevented by the line arrangement member 65. Then, the lines are guided horizontally by the frame 64 and allowed to enter the coolant line arrangement space 27. At this time, in order to prevent the deformation of the heating insulating material due to the contact between the four coolant supply lines 61 and the four coolant return lines 62, a line arrangement member 66 having a two-stage structure is provided at a horizontal portion of the four coolant supply lines 61 and a horizontal portion of the four coolant return lines 62 to divide the four coolant supply lines 61 and the four coolant return lines 62 into an upper part and a lower part. If necessary, the line arrangement member 65 may be provided in the horizontal portion.

As shown in FIG. 6, the line arrangement member 65 has two plates 67, each having four protrusions 67a projecting outward in a triangular shape corresponding to the respective lines 61 (62), and the lines 61 (62) are disposed between the two plates 67 with heat insulating materials 68 interposed therebetween. The line arrangement member 66 has a configuration in which the line arrangement: members 65 are connected in two stages.

The four coolant supply lines 61 and the four coolant return lines 62 extending from each chiller unit 120 are inserted into each coolant line arrangement space 27 of the system main body 200.

The system main body 200 including twelve inspection units 30 and the transfer system has a complicated structure Therefore, it is difficult to set all the regions in the system main body 200 to a low dew point environment. In the present embodiment, various ways to prevent condensation are examined.

Figure 9:
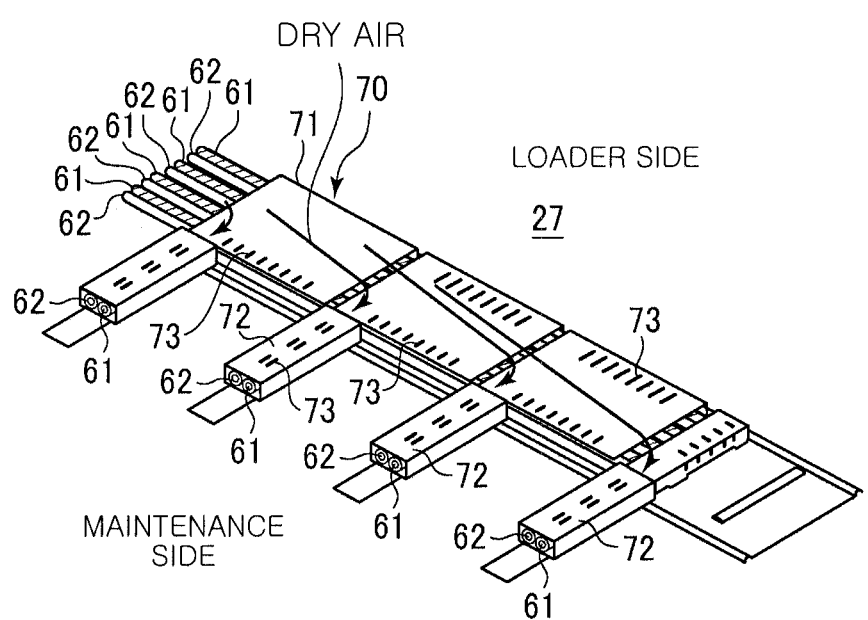
FIG. 9 is a perspective view showing a state in which the coolant supply line and the coolant return line are covered with a lid in a coolant line arrangement space.

In the coolant line arrangement space 27, it is difficult to thickly cover the lines with the heat insulating material in view of space saving. Therefore, the thickness of the heat insulating material is set to, e.g., about 6 mm, and the coolant supply lines 61 and the coolant return lines 62 are covered with a resin cover 70 as can be seen from FIG. 9. A low dew point environment is created by supplying dry air having a dew point temperature lower than a temperature of the coolant, preferably dry air having a dew point temperature of −45° C. or less, e.g., −70° C., at an appropriate flow rate into the cover 70. Dry air supplied from a dry air supply unit (not shown) is from the coolant supply unit 300 side through the lines.

The cover 70 includes a main cover 71 provided along a longitudinal direction (X direction) of the coolant line arrangement space 27, and individual covers 72 extending from the main cover 71 toward the maintenance side (rear side) at positions corresponding to the four inspection units 30. As shown in FIG. 10, the four coolant supply lines 61 and the four coolant return lines 62, which are alternately arranged, reach the main cover 71 at the entrance side of the coolant line arrangement space 27 and are sequentially distributed from the main cover 71 to the four individual covers 72.

Dry air is supplied to create a low dew point environment and prevent condensation. However, if the cover 70 is sealed, dry air stays in the cover 70 and the surface temperatures of the coolant supply lines 61 and the coolant return lines 62 are lowered, which results in condensation. Therefore, a plurality of slits 73 is formed in the cover 70, and dry air is discharged through the slits 73. Accordingly, the flow of dry air in the cover 70 is improved and condensation is prevented. The slits 73 are formed on the surfaces of the main cover 71 and the individual covers 72 of the cover 70. The flow of the dry air is controlled by increasing the number of slits 73 at a downstream side of the flow of dry air.

Figure 11A:
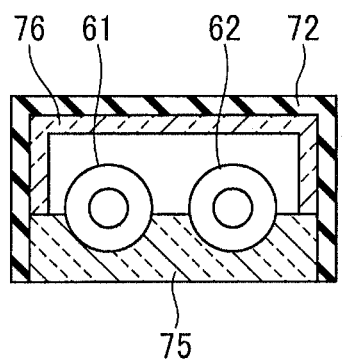
FIGS. 11A and 11B are cross sectional views showing the arrangement state of the coolant supply line and the coolant return line in the coolant line arrangement space.
Figure 11B:
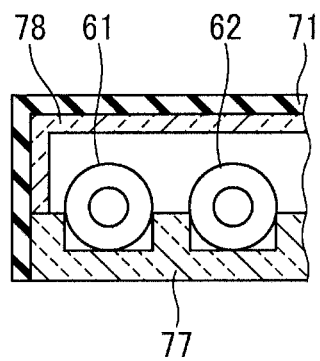

When the coolant supply lines 61 and the coolant return lines 62 are densely arranged, the convection of dry air between the lines becomes poor and condensation occurs. Accordingly, as shown in FIG. 10, the lines are distributed into groups directed toward the respective inspection units 30 to avoid dense arrangement. If the lines are brought into contact with each other at a portion where the lines are disposed in parallel, the convection of dry air becomes poor at that portion and condensation occurs. Therefore, in the individual covers 72, as shown in FIG. 11A, a spacer heat insulating material 75 having recesses corresponding to the lines is provided below the coolant supply line 61 and the coolant return line 62, and a space of, e.g., about 10 mm, is provided between the coolant supply line 61 and the coolant return line 62. In the main cover 71, as shown in FIG. 11B, a spacer heat insulating material 77 having spacers between these lines is provided below the coolant supply line 61 and the coolant return line 62, and a gap of, e.g., 2.5 mm, is provided between the coolant supply line 61 and the coolant return line 62 in order to improve the convection of dry air between the lines and ensure the convection between the lines. The individual covers 72 and the main cover 71 are made of resin, and insulating materials 76 and 78 are provided therein. Accordingly, condensation on the surface of the cover 70 can be prevented. Further, the convection of dry air in the individual covers 72 and the main cover 71 is ensured by setting a distance between the coolant supply line 61 and the coolant return line 62 and the heat insulating materials 76 and 78 to 5 mm or more.

Figure 12:
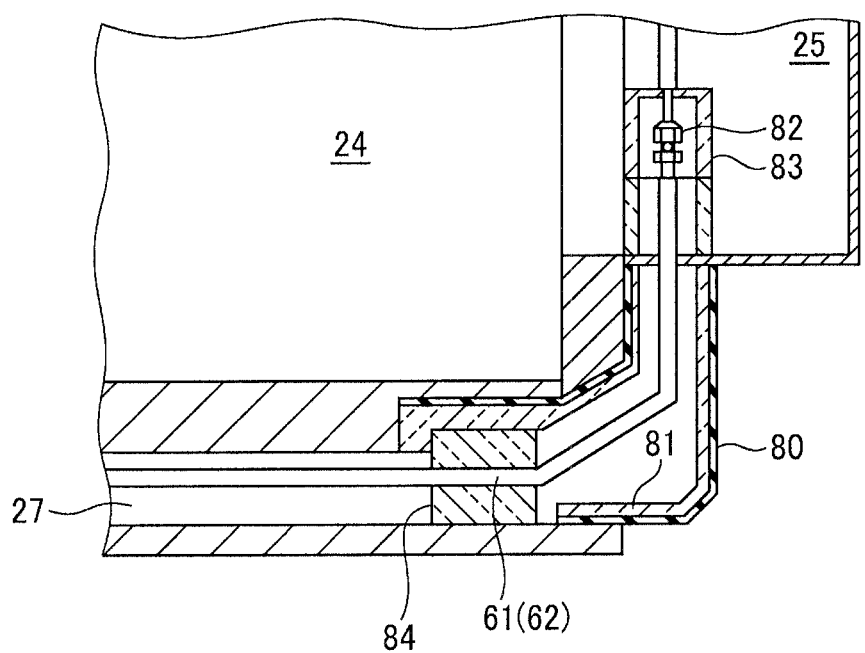
FIG. 12 is a cross sectional view for explaining a portion where the coolant supply line and the coolant return line from the coolant line arrangement space reach a control unit.

As described above, the coolant supply line 61 and the coolant return line 62 which have reached the maintenance side of the coolant line arrangement space 27 are bent upward and reach the cell control unit 25. As shown in FIG. 12, the bent portion is covered with a resin cover 60 having an inner surface covered with a heat insulating material 81, thereby preventing condensation.

The upper inspection space 12a, the intermediate inspection space 12b, and the lower inspection space 12c are independent spaces separated from each other. Dry air having a dew point temperature lower than the temperature of the coolant is supplied into these spaces. Accordingly, a low dew point environment is created in the inspection chamber 24 and the cell control unit 25. Dry air is purged at a predetermined flow rate from the cell control unit 25 to the resin cover 80 through a dry air tube (not shown) and then discharged to the outside.

In order to guide the coolant supply line 61 and the coolant return line 62 from the coolant line arrangement space 27 to the chuck top 36, the coolant supply line 61 and the coolant return line 62 are connected to a metal joint 32 (only one is shown) fixed in the middle thereof. The metal joint 82 is provided in the cell control unit 25 in a low dew point environment. Therefore, it is possible to suppress condensation on the metal joint 82. However, the metal joint 82 is resin-fixed, and condensation may occur at components (cover, screws or the like) near the low-temperature metal joint 82 through the resin. Accordingly, the metal joint 82 including a fixing part is covered with a heat insulating material cover 83. A reference numeral 84 denotes a spacer.

The coolant supply line 61 and the coolant return line 62 from the metal joint 82 reach the inspection chamber 24 from the cell control unit 25 and are connected to the chuck top 36 of the inspection unit 30. At this time, condensation does not occur at the chuck top 36 and other members due to a low dew point environment created in the inspection chamber 24 and the cell control unit 25 and convection of dry air.

The control unit 90 is basically a computer and includes a main controller having a CPU, an input device (keyboard, mouse or the like), an output device (printer or the like), a display device (display or the like), and a storage device (storage medium). The main controller controls the respective components of the inspection system 100, e.g., the testers 31 of the inspection units 30, the vacuum suction mechanism, the aligner 28, the transfer mechanism 22, the chiller unit 120 and the like, and also controls the supply of dry air. The main controller of the control unit 90 controls the inspection system 100 to perform a predetermined operation based on, e.g., a processing recipe stored in a storage medium built in the storage device or a storage medium set in the storage device.

In the inspection system 100 configured as described above, the surface temperature of the chuck top 36 is set to, e.g., −30° C., by supplying a coolant from the chiller unit 120 of the coolant supply unit 300 to the chuck top 36 of each inspection unit 30 of the system main body 200, and the electrical inspection of the wafer K is performed in a low temperature environment.

In the system main body 200, the operations of transferring the wafer W from the FOUP 18 mounted on the mounting table 19 of the loader unit 13 to each inspection unit 30 by the transfer mechanism 22, performing the electrical inspection on the wafer W, and returning the wafer W after the inspection to the FOUP 18 by the transfer mechanism 22 are performed concurrently and consecutively.

The supply of the coolant to the chuck tops 36 of the plurality of inspection units 30 through the coolant lines is not considered, and it is considered to directly connect the coolant lines to the chuck tops 36 from the outside in view of a single inspection unit. However, if the coolant lines are directly connected to the chuck tops 36 from the outside, it is difficult to perform maintenance. In addition, since the inspection system having a plurality of inspection units has a complicated structure, it is difficult to deal with condensation, and a space for extending the coolant lines is required, which makes it difficult to save space.

On the other hand, in the present embodiment, the coolant supply line 63 and the coolant return line 62 as coolant lines introduced from the chiller unit 120 of the coolant supply unit 300 into the system main body 200 are extended to the dedicated coolant line arrangement space 27 provided below the inspection chambers 24 in each stage and are connected to the chuck top 36 of the inspection unit 30 in each inspection chamber 24. Therefore, the coolant can be supplied to the chuck top 36 without hindering the maintenance. Further, since the coolant supply line 61 and the coolant return line 62 are provided in the dedicated coolant line arrangement space 27, there are no other components and it is easy to deal with condensation. In addition, there is no need to extend the coolant line to a portion where various devices are provided. The coolant line arrangement space 21 may be small as long as the coolant lines can be disposed, which makes it possible to save the space.

In the coolant line arrangement space 27, the coolant supply line 61 and the coolant return line 62 are covered with a heat insulating material having a thickness enough to realize space saving and then covered with the cover 70 including the main cover 71 and the individual covers 72. The coolant supply line 61 and the coolant return line 62 are guided to a position corresponding to each inspection chamber 24 on the maintenance side while creating a low dew point environment by supplying dry air having a dew point temperature lower than the temperature of the coolant and causing convection of the dry air. Therefore, in the coolant line arrangement space 27, the surface temperatures of the coolant supply line 61 and the coolant return line 62 can become higher than the dew point temperature and it is possible to prevent condensation on the surfaces of the lines.

At this time, due to a small inner space of the cover, the flow of dry air may become poor and condensation may occur due to the low surface temperatures of the coolant supply line 61 and the coolant return line 62. On the other hand, the flow of dry air is improved by discharging dry air through the slits 73 formed in the cover 70 to the outside. Therefore, condensation on the surfaces of the lines can be more effectively prevented.

Among the plurality of coolant supply lines 61 and the plurality of coolant return lines 62 in the main cover 71, the lines are distributed in groups directed to the respective inspection units 30 to avoid dense arrangement. Further, the coolant supply line 61 and the coolant return line 62 are provided on the spacer heat insulating materials 75 and 77. Accordingly, a space is generated between the lines, and it is possible to prevent condensation from occurring due to dry air staying between the lines. In addition, the cover 70 is made of resin and a heat insulating material is provided therein, which makes it possible to suppress a decrease in the surface temperature of the cover 70 and prevent condensation on the surface of the cover 70.

The cell control unit 25 having therein electric devices and air/vacuum devices for performing various control of the inspection unit 30 is provided at the maintenance side (rear side) of each inspection chamber 24. Further, the inspection chamber 24 and the cell control unit 25 are made to communicate with each other, and a low dew point environment is created therein by supplying dry air having a dew point temperature lower than the temperature of the coolant. Therefore, condensation on the devices in the cell control unit 25 is prevented. Even if air enters during the transfer of the wafer W on the chuck top 36, the condensation on the devices can be prevented. The metal joint 82 of the coolant supply line 63 and the coolant return line 62 is provided in the cell control unit 25 under the low dew point environment, and the metal joint 82 including the fixing part is covered with the heat insulating cover 83. Accordingly, it is possible to prevent condensation on the metal joint 82 and its surrounding components (cover, screws or the like).

The transfer mechanism 22 transfers the wafer W with respect to the chuck top 36 of the inspection unit in a state where the frame-shaped member 55 is brought into close contact with a peripheral portion of the transfer port 24a of the inspection chamber 24 by opening the shutter 26 after a low dew point environment is created by supplying dry air having a low dew point into the cover member 54 in a state where the transfer arm 51 is surrounded by the cover member 54 and the transfer port 54a of the cover member 54 is shielded by a shielding wall (not shown). Accordingly, condensation on the chuck top can be prevented even during the transfer of the wafer W. Even if air enters the inspection chamber 24 and the cell control unit 25 during the transfer of the wafer W, the low dew point environment therein is hardly affected.

The coolant supply line 61 and the coolant return line 62 between the coolant supply unit 300 and the system main body 200 are covered with a thick heat insulating material having high insulating property such as foamed urethane or the like. Therefore, the surface temperature of the coolant supply line 61 and the coolant return line 62 becomes higher than the dew point. Further, due to the presence of the frame 64 for guiding the lines, the line arrangement member 65 for fixing the lines with a gap interposed therebetween, and the line arrangement member 66 for fixing the lines in a two stage structure, the deformation of the heat insulating material by the contact between the lines can be prevented and, further, the decrease in the heat insulating effect can be prevented. Accordingly, it is possible to prevent condensation on the coolant supply line 61 and the coolant return line 62 between the coolant supply unit 300 and the system main body 200.

The present disclosure is not limited to the above embodiment, and various modifications can be made within the scope of the idea of the present disclosure.

For example, in the above-described embodiment, the coolant line arrangement space of the system main body is disposed below each stage in which the inspection chambers are arranged. However, the present disclosure is not limited thereto, and the coolant line arrangement space may be provided above each stage.

In the above-described embodiment, four inspection chambers are arranged in one stage and three stages are provided in a height direction. However, the present disclosure is not limited thereto, and the number of stages may vary depending on the arrangement space of the inspection system.

In the above-described embodiment, the transfer mechanism has a configuration in which the cover member for encompassing the transfer arm is provided, and the inner space of the cover member can be set to a low dew point environment by suppling dry air thereinto during the transfer of the wafer with respect to the chuck top in the inspection chamber. However, the wafer may be transferred in an atmospheric atmosphere without providing the cover member. In that case as well, it is possible to efficiently prevent condensation without being greatly affected by the low dew point environment of the inspection chamber or the like.

While the present disclosure has been shown and described with respect to the embodiments, it will be understood by those skilled in the art that various changes and modifications may be made without departing from the scope of the present disclosure as defined in the following claims.

What is claimed is:

1. An inspection system for inspecting an inspection target on a stage in a low temperature environment, the system comprising:
    a system main body including an inspection apparatus having a plurality of inspection chambers each accommodating an inspection unit for performing electrical inspection of an inspection target on a stage and having a plurality of inspection spaces which are arranged in multiple stages in a vertical direction and formed by arranging the plurality of inspection chambers in a horizontal direction, and a loader unit configured to transfer the inspection target with respect to the stage of the inspection unit of the inspection apparatus; and
    a coolant supply unit configured to supply a coolant to the stage,
    wherein the system main body further includes a plurality of coolant line arrangement spaces, in which a plurality of coolant lines extending from the coolant supply unit are arranged, being provided above or below the respective inspection spaces to correspond to the respective inspection spaces, and
    the coolant lines are directed toward the corresponding inspection spaces in each of the coolant line arrangement spaces.

2. The inspection system of claim 1, wherein a heat insulating material covers the coolant lines.

3. The inspection system of claim 2, wherein the system main body has a cover covering the coolant lines in each of the coolant line arrangement spaces, and dry air having a dew point temperature lower than a temperature of the coolant is supplied into the cover to create a low dew point environment inside the cover.

4. The inspection system of claim 3, wherein the cover has slits and the dry air is discharged through the slits.

5. The inspection system of claim 3, wherein the cover includes a main cover for guiding the coolant lines inserted into the coolant line arrangement space from the coolant supply unit side along a longitudinal direction of the coolant line arrangement space, and a plurality of individual covers covering the coolant lines directed toward the corresponding inspection units in each of the inspection spaces.

6. The inspection system of claim 5, wherein in each of the coolant line arrangement spaces, the coolant lines are distributed in groups directed toward the respective inspection units.

7. The inspection system of claim 5, wherein in each of the coolant line arrangement spaces, the coolant lines adjacent to each other are spaced apart from each other with a gap interposed therebetween by a spacer heat insulating material.

8. The inspection system of claim 7, wherein the coolant lines include a coolant supply line for supplying the coolant to the stage and a coolant return line for returning the coolant from the stage to the coolant supply unit; the coolant supply line and the coolant return line are alternately arranged in the main cover; the coolant supply line and the coolant return line are sequentially distributed in pair from the main cover to the individual covers; and the spacer heat insulating material is provided between the coolant supply line and the coolant return line adjacent to each other in the main cover with a gap interposed therebetween and between the coolant supply line and the coolant return line in the individual covers with a gap interposed therebetween.

9. The inspection system of claim 3, wherein the cover is made of resin, and a heat insulating material is provided inside the cover.

10. The inspection system of claim 2, wherein an insulating material covers portions of the coolant lines extending from the coolant supply unit to the system main body to prevent condensation on surfaces of the coolant lines in an atmospheric atmosphere of a room temperature, and
    a frame for guiding the coolant lines and a line arrangement member for fixing the coolant lines with a gap interposed therebetween are provided to prevent deformation of the heat insulating material due to contact between the coolant lines.

11. The inspection system of claim 1, wherein a low dew point environment is created in the inspection chambers by supplying dry air having a low dew point temperature into the inspection spaces; and in the coolant line arrangement space in each stage, the coolant lines extend toward a rear side opposite to the loader unit side and are inserted into a corresponding inspection chamber from the rear side and connected to the stage.

12. The inspection system of claim 11, wherein a control unit in which a control device of the inspection unit is disposed is provided at a rear side of each of the inspection chambers to communicate with the corresponding inspection chamber; a dew point environment is created in the control unit by supplying dry air into the control unit; and the coolant lines are connected to the stage in the corresponding inspection chamber through the control unit from the coolant line arrangement space.

13. The inspection system of claim 12, wherein portions of the coolant lines which reach the control unit from each of the coolant line arrangement spaces are covered with a resin cover having therein a heat insulating material.

14. The inspection system of claim 12, wherein the coolant lines from each of the coolant line arrangement spaces are connected to a fixed metal joint; the metal joint is provided in the control unit under the low dew point environment; and the metal joint including a fixing part is covered with a heat insulating material cover.

15. The inspection system of claim 11, wherein a shutter is provided at the loader unit side of each of the inspection chambers and opened only when the inspection target is transferred with respect to the stage by a transfer mechanism of the loader unit.

16. The inspection system of claim 15, wherein the transfer mechanism includes: a rotatable transfer arm for transferring the inspection target; a cover member encompassing the transfer arm and having a transfer port for the inspection target, the cover member being rotatable together with the transfer arm; and a shielding wall, provided outside the cover member, for shielding the transfer port, and the transfer mechanism transfers the inspection target between the transfer arm and the stage by opening the shutter in a state where the transfer port is aligned with a transfer port of the inspection chamber after a low dew point environment is created in the cover member by supplying dry air having a low dew point into the cover member in a state where the transfer port is shielded by the shielding wall by rotating the cover member.

* * * * *